(12) United States Patent
Yong et al.

(10) Patent No.: US 10,396,834 B2
(45) Date of Patent: Aug. 27, 2019

(54) APPARATUS AND METHOD FOR ADAPTIVE COMMON MODE NOISE DECOMPOSITION AND TUNING

(71) Applicant: Intel Corporation, Santa Clara, CA (US)

(72) Inventors: Khang Choong Yong, Puchong (MY); Boon Ping Koh, Seberang Jaya (MY); Amit Kumar Srivastava, Penang (MY); Wil Choon Song, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 241 days.

(21) Appl. No.: 15/276,689

(22) Filed: Sep. 26, 2016

(65) Prior Publication Data

US 2017/0077969 A1    Mar. 16, 2017

Related U.S. Application Data

(63) Continuation of application No. 14/483,486, filed on Sep. 11, 2014, now Pat. No. 9,455,752.

(51) Int. Cl.
*H04B 1/04* (2006.01)

(52) U.S. Cl.
CPC ......... *H04B 1/0475* (2013.01); *H04B 1/0483* (2013.01); *H04B 2001/0408* (2013.01); *H04B 2001/0433* (2013.01)

(58) Field of Classification Search
CPC ............... H03K 17/145; H03K 17/161; H03K 17/6871; H04B 1/0475; H04B 1/0483; H04B 2001/0433; H04B 2001/0408; H03M 1/1245; H04L 27/36
See application file for complete search history.

(56) References Cited

U.S. PATENT DOCUMENTS

| | | | |
|---|---|---|---|
| 6,052,420 A | 4/2000 | Yeap et al. | |
| 6,546,057 B1 | 4/2003 | Yeap | |
| 7,301,371 B2* | 11/2007 | Kim | G11C 7/1048 326/112 |
| 7,495,479 B1* | 2/2009 | Hsu | G11C 27/024 327/94 |
| 7,636,554 B2* | 12/2009 | Sugar | H04B 1/005 455/272 |
| 7,683,656 B1 | 3/2010 | Ho | |
| 7,919,984 B2 | 4/2011 | Balamurugan et al. | |
| 7,953,162 B2* | 5/2011 | Shetty | H04W 52/52 370/311 |

(Continued)

OTHER PUBLICATIONS

International Preliminary Report on Patentability dated Mar. 23, 2017 for PCT Patent Application No. PCT/US15/43687.

(Continued)

*Primary Examiner* — Rahel Guarino
(74) *Attorney, Agent, or Firm* — Green, Howard & Mughal LLP

(57) ABSTRACT

Described is an apparatus which comprises: a pre-driver coupled to a transmitter, the transmitter having a differential output; and a tuning circuit operable to couple to the differential output to tune the pre-driver of the transmitter according to a common mode noise signature of a common mode signal derived from the differential output.

18 Claims, 12 Drawing Sheets

(56) References Cited

U.S. PATENT DOCUMENTS

| | | |
|---|---|---|
| 8,319,549 B2 | 11/2012 | Sengupta |
| 8,669,782 B1 | 3/2014 | Fortin et al. |
| 2006/0050571 A1 | 3/2006 | Kim |
| 2010/0127736 A1 | 5/2010 | Dixit et al. |
| 2011/0292977 A1 | 12/2011 | Farjadrad |
| 2013/0194005 A1 | 8/2013 | Voutilainen et al. |
| 2014/0211832 A1 | 7/2014 | Diab et al. |

OTHER PUBLICATIONS

Office Action, dated Dec. 7, 2016, for Taiwan Patent Application No. 104125429.
Extended European Search Report from European Patent Application No. 15840070.5 notified Mar. 19, 2018, 10 pgs.
International Search Report and Written Opinion, dated Nov. 13, 2015, for PCT Patent Application No. PCT/US2015/043687.
Non-Final Office Action for U.S. Appl. No. 14/483,486 dated Feb. 1, 2016, 6 pages.
Notice of Allowance for U.S. Appl. No. 14/483,486 dated May 24, 2016, 9 pages.
Non-Final Office Action from Chinese Patent Application No. 201580042586.0 notified Jan. 28, 2019, 16 pgs.

\* cited by examiner

APPARATUS AND METHOD FOR ADAPTIVE COMMON MODE NOISE DECOMPOSITION AND TUNING

PRIORITY CLAIM

This application is a continuation of, and claims priority to, U.S. patent application Ser. No. 14/483,486, filed on 11 Sep. 2014, titled "APPARATUS AND METHOD FOR ADAPTIVE COMMON MODE NOISE DECOMPOSITION AND TUNING," which is incorporated herein by reference in entirety for all purposes.

BACKGROUND

Common mode noise (CMN) is the noise formed when differential signals do not perfectly compliment to each other. Common mode voltage (Vcm) of differential signals having voltages Vdp and Vdn is defined as Vcm=(Vdp+Vdn)/k, where 'k' is a constant (e.g., k=2). CMN is generated from differential signals due to phase misalignment of the differential signals, rise and fall time mismatch, amplitude mismatch, mismatch in skew between differential signals and timing mismatch due to non-ideal differential signaling from an IO (input-output) buffer. CMN is also generated by non-idealities or mismatch introduced due to platform component (e.g., differential trace length; via mismatch; impedance mismatch, etc).

CMN is currently controlled using an on-board Common-Mode Choke (CMC). But adding CMC increases manufacturing cost which may not be a viable solution for producing low cost products. Adding CMC also causes CMN to differential gain if CMN is not cancelled at the platform or board level which results in overshoot, undershoot, and ringing to the differential signals. Overshoot and undershoot voltage caused by CMN may be so high that they may cause reliability issues for the devices.

CMN is also currently controlled, during the design and layout phases of the IO buffer, by controlling signal timing skew, control of signal rise/fall-time, and signal amplitude skew. However, such an approach is static and does not account for non-idealities of the actual design when being used in a real product.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
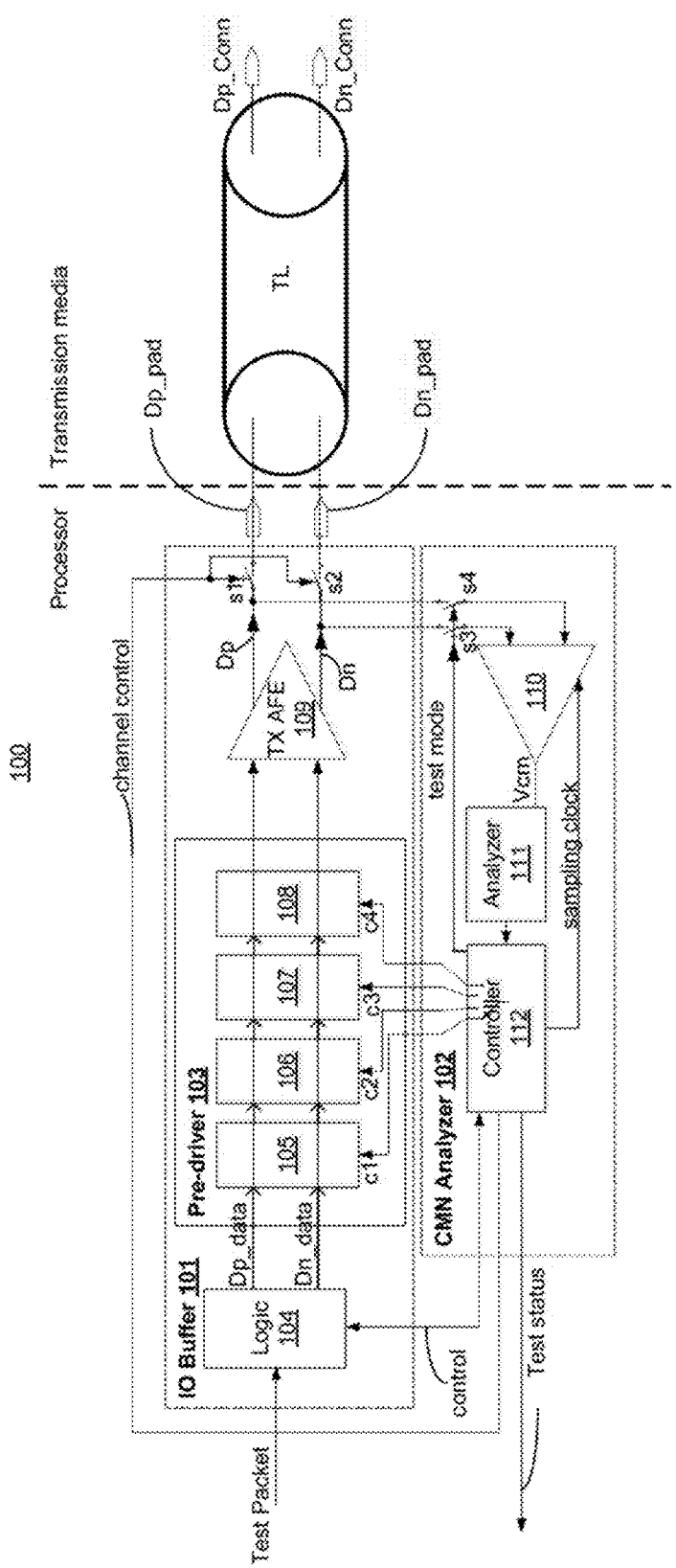
FIG. 1A illustrates an apparatus to detect, decompose, and tune Common Mode Noise (CMN), according to some embodiments of the disclosure.

Some embodiments describe a Common Mode Noise (CMN) detection and decomposition technique to sense different signatures of reflected CMN, and to identify the root cause (or source(s)) of CMN. Some embodiments describe an adaptive CMN tuning technique by which differential signal's rise/fall-time mismatch, amplitude mismatch, and timing skew are tuned on-the-fly (i.e., adaptive tuning) based on the CMN detection and decomposition information.

There are many technical effects of various embodiments. For example, with CMN being controlled on-the-fly, Electromagnetic Interference (EMI) is better suppressed compared to the Common Mode Choke (CMC) solution. Increasing the CMC impedance value, for example from 90Ω to 120Ω, may reduce emission by 5 dB, however, such reduction in emission is not sufficient to lower the emission to meet the EMC requirement. Nonetheless, the on-die apparatus of various embodiments reduces emission to meet the Electromagnetic Compatibility (EMC) requirement leaving little or no CMN from the differential signal.

Some embodiments also reduce overall manufacturing costs by providing an on-die solution and removing the off-die CMC. Some embodiments reduce Time-to-Market (TTM) of the product by relaxing customer integration effort (e.g., by reducing platform component and the EMI validation cycle). Some embodiments, improve signal integrity (SI) performance. Some embodiments, remove overshoot or insertion loss concerns compared to the CMC solution. Some embodiments provide a robust solution to process, voltage, and temperature (PVT) variations and aging by controlling signal rise/fall-time mismatch, amplitude mismatch, and timing skew on-die. Other technical effects will be evident from various embodiments described.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors in various circuits and logic blocks are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1A illustrates apparatus 100 to detect, decompose, and tune CMN, according to some embodiments of the disclosure. In some embodiments, circuit 100 comprises IO (input-output) Buffer 101 and CMN Analyzer 102. In some embodiments, IO Buffer 101 comprises Pre-Driver 103, Logic 104, Analog Front-End (AFE) of a transmitter (TX) 109; and switches s1 and s2.

In some embodiments, Pre-Driver 103 includes one or more circuits (e.g., circuits 105-108) that are controlled by CMN Analyzer 102 to reduce or zero out CMN from differential signals Dp and Dn upon getting indication by CMN Analyzer 102 which senses the CMN signature. In some embodiments, Pre-Driver 103 receives differential signals Dp_data and Dn_data from Logic 104 and may adjust one or more parameters (e.g., impedance, rise/fall times, amplitudes, propagation delay; series RC network in pre-driver path; Pre-Driver 103 power supply level; Miller capacitance based slew rate control capacitor, drive strength of Pre-Driver 103, etc.) associated with the differential signals Dp_data and Dn_data to control various signal attributes of the differential signals Dp and Dn output by TX AFE 109 on pads Dp_pad and Dn_pad, respectively.

In some embodiments, Logic 104 receives data packet as input for transmission and generates differential signal Dp_data and Dn_data for Pre-driver 103. In some embodiments, for CMN analyses and tuning, Logic 104 receives a Test Packet as input and generates differential signals Dp_data and Dn_data for Pre-driver 103. In some embodiments, after CMN is tuned, Logic 104 receives regular data for transmission to Transmission Line (TL). In some embodiments, CMN Tuning control block is enabled during cold boot or enabled periodically. For example, CMN signature may be periodically sampled (or sampled once during cold boot) in the background after a packet of data is transmitted by TX AFE 109.

In some embodiments, the circuits of Pre-Driver 103 include an impedance control circuit 105 to control or adjust termination impedance of TX AFE 109. In some embodiments, the circuits of Pre-Driver 103 include a Slew-Rate Control circuit 106 to control or adjust rise time (RT) and fall time (FT) of signals on pads Dp_pad and Dn_pad coupled to TX AFE 109. Slew-Rate Control circuit 106 is also referred to as RT/FT Control circuit. In some embodiments, the circuits of Pre-Driver 103 include a Timing Control circuit 107 for adjusting propagation delay of differential signals Dp_data and Dn_data. In some embodiments, the circuits of Pre-Driver 103 include an Amplitude Control circuit 108 to control the amplitude of differential signals Dp and Dn.

In some embodiments, circuits of Pre-Driver 103 include: series RC network in the pre-driver path; circuits for controlling power supply to Pre-driver 103; circuits for controlling Miller capacitance based slew rate control capacitor; and circuits for adjusting drive strength of Pre-Driver 103 to control inputs to TX AFE 109. In some embodiments, circuits 105, 106, 107, and 108 are controlled by control signals c1, c2, c3, and c4, respectively. Here, labels for signals and nodes are interchangeably used. For example, Dp and Dn indicate nodes or signals depending on the context of the sentence.

In some embodiments, CMN Analyzer 102 comprises Summer 110, CMN voltage Analyzer 111, and Controller 112. In some embodiments, CMN Analyzer 102 comprises switches s1 and s4 to enable CMN Analyzer 102 to begin CMN analysis. In some embodiments, switches s3 and s4 are controlled by test mode signal generated by Controller 112. In some embodiments, Summer 110 comprises input nodes coupled to Dp and Dn; and output node Vcm to provide Vcm to Analyzer 111.

In some embodiments, Summer 110 is a switch capacitor based circuit that uses sampling clock to sample and hold signals Dp and Dn to integrate them to generate Vcm. In some embodiments, Summer 110 comprises an active operational amplifier (OPAMP) to integrate signals Dp and DN to generate Vcm. In some embodiments, Summer 110 is a Gm (i.e., trans-conductance) based summer circuit or a passive summer circuit.

In some embodiments, voltage Analyzer 111 receives Vcm and determines one or more sources of CMN. In some embodiments, decomposing the various sources of CMN is performed on signals Dp and Dn (via Vcm) when switches s1 and s2 are open (i.e., TL is disconnected from TX AFE 109) and when switches s1 and s2 are closed (i.e., TL is connected to TX AFE 109). This allows voltage Analyzer 111 to determine sources of CMN from IO Buffer 101 alone and with the combination of IO Buffer 101 and TL reflections.

Figure 1B:
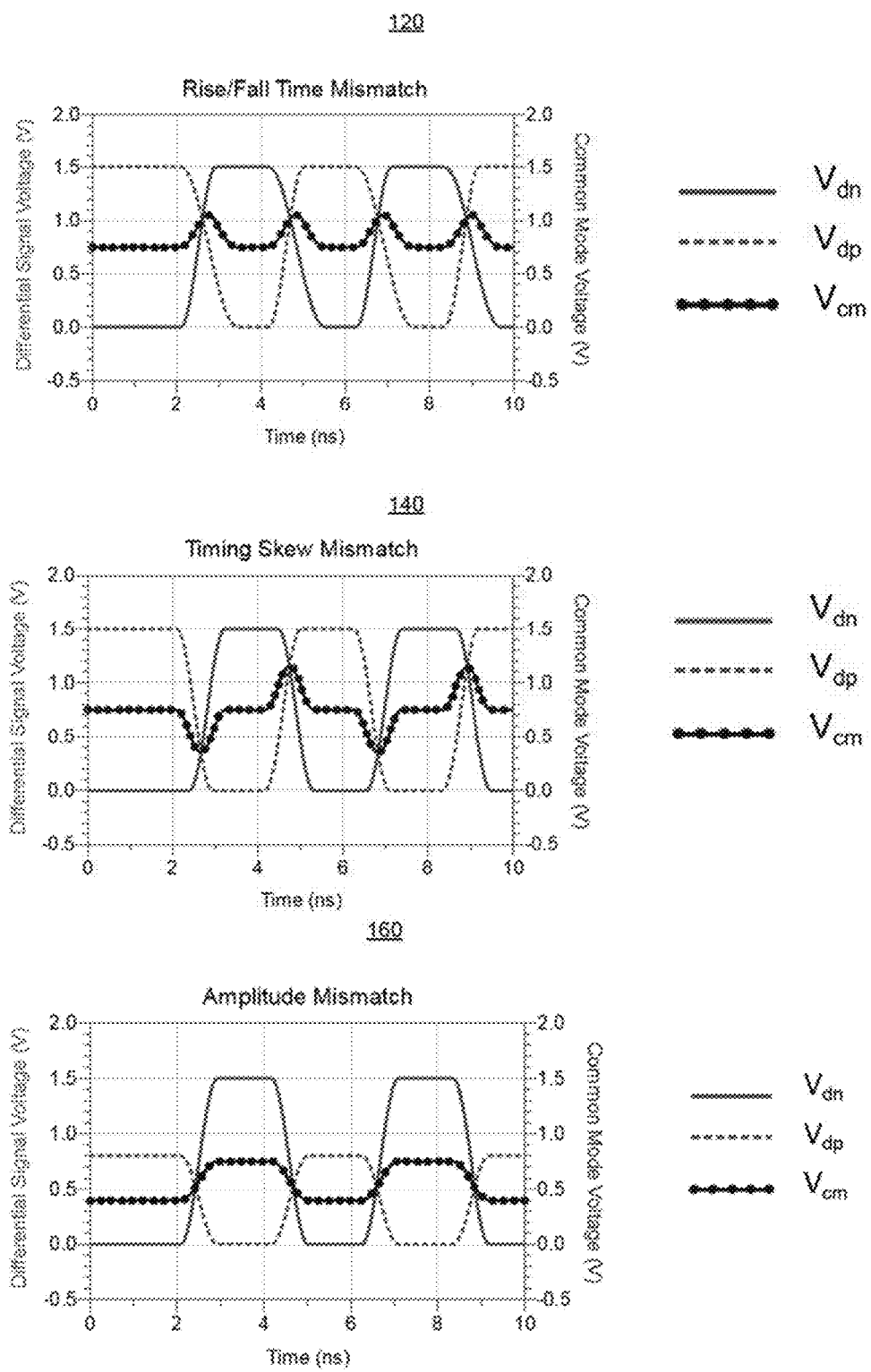
FIG. 1B illustrates CMN signature characteristics which are used by the circuit of FIG. 1A to detect CMN, according to some embodiments of the disclosure.

FIG. 1B illustrates plots 120, 140, and 160 with CMN signature characteristics which are used by voltage Analyzer 111 to detect and identify the root cause (or source(s)) of CMN, according to some embodiments of the disclosure. Table 1 shows two columns—Source of CMN and Signature Characteristics. Here, three sources of CMN are described—RT/FT mismatch, Timing skew, and Amplitude mismatch.

TABLE 1

Signature Characteristics

| Source of CMN | Signature Characteristics |
| --- | --- |
| RT/FT Mismatch | 1 polarity<br>   Sample Vcm at UI interval<br>  Up trend:<br>    RT is shorter than FT.<br>  Down trend:<br>    RT is longer than FT. |
| Timing Mismatch | 2 polarities<br>   Sample Vcm at UI interval<br>  Up-Down trend:<br>    TOF for differential trace Dp is shorter than TOF for differential trace Dn<br>  Down-Up trend:<br>    TOF for differential trace Dp is longer than TOF for differential trace Dn |
| Amplitude Mismatch | 2 polarities<br>   Sample Vcm at UI interval, after 0.5UI delay<br>  Up-Down trend:<br>    Voltage at Dp has larger amplitude than voltage at Dn<br>  Down-Up trend:<br>    Voltage at Dp has lower amplitude than voltage at Dn |

For RT/FT mismatch, the signature characteristics of Vcm is that the sampled Vcm in a UI (i.e., unit interval) has a single polarity (e.g., up or down humps relative to the DC level of Vcm). The trend for up hump occurs when RT is shorter than FT. The trend for down hump occurs when RT is longer than FT. The signature characteristic for RT/FT mismatch is shown in plot 120 showing Dp and Dn signals and corresponding Vcm. In this example, Vcm has up humps (i.e., RT of Dp and Dn is shorter than FT of Dp and Dn signals).

For timing mismatch, the signature characteristic of Vcm has two polarities (i.e., up and down humps relative to the DC level of Vcm) within a sample of a UI of Vcm. The trend for up-down humps occurs when Time of Flight (TOF) i.e., propagation delay, for differential trace Dp is shorter than TOF for differential trace Dn. The trend for down-up humps occurs when TOF for differential trace Dp is longer than TOF for differential trace Dn. The signature characteristic for timing mismatch is shown in plot 140 showing Dp and Dn signals and corresponding Vcm.

For amplitude mismatch, the signature characteristics of Vcm has two polarities (i.e., up and down humps relative to the DC level of Vcm) in a UI of Vcm, after the first edge of Vcm is delayed by 1.5 UI. The trend for up-down humps occurs when amplitude of Dp is larger than amplitude of Dn. The trend for down-up humps occurs when amplitude of Dp is lower than amplitude of Dn. The signature characteristic for amplitude mismatch is shown in plot 160 showing Dp and Dn signals and corresponding Vcm.

Referring back to FIG. 1A, in some embodiments, voltage Analyzer 111 provides its findings about the type of CMN on Vcm to Controller 112. In some embodiments, Controller 112 adjusts one or more circuits 105-108 to cancel out CMN on differential signals Dp and Dn. For example, Controller 112 may use control c4 to change the amplitudes of Dp and/or Dn; Controller 112 may use control c3 to adjust propagation delays of Dp and/or Dn; Controller 112 may use control c2 to adjust RT/FT of Dp and/or Dn; and Controller 112 may use control c1 to adjust termination impedance (hence reflections, overshoot, undershoot, etc.) of Dp and/or Dn.

In some embodiments, Controller 112 is operable to change various characteristics of Dp_data and Dn_data via the control signal(s). For example, Controller 112 is operable to change various characteristics of Dp_data and Dn_data to drive pattern through Logic 104 when measuring or analyzing CMN characteristics. In some embodiments, when Controller 112 determines that CMN is substantially cancelled (or is zero) then it outputs a Test status indicating that CMN tuning is complete and selects functional data path for normal data transmission. In some embodiments, when Controller 112 determines that it can not identify the signature of CMN, it indicates an error via the Test status. After cancelling CMN, IO Buffer 101 can proceed with normal transmission service. In such embodiments, switches s1 and s2 are closed and switches s3 and s4 are open.

In some embodiments, an operating system (or other firmware or software) may cause CMN tuning to begin or end. For example, when the processor having IO Buffer 101 exits a sleep mode (to wake up), CMN Analyzer 102 may enter test mode and channel control signal from Controller 112 may control switches s1 and s2 to decompose the CMN on Vcm and cancel CMN out.

Figure 2:
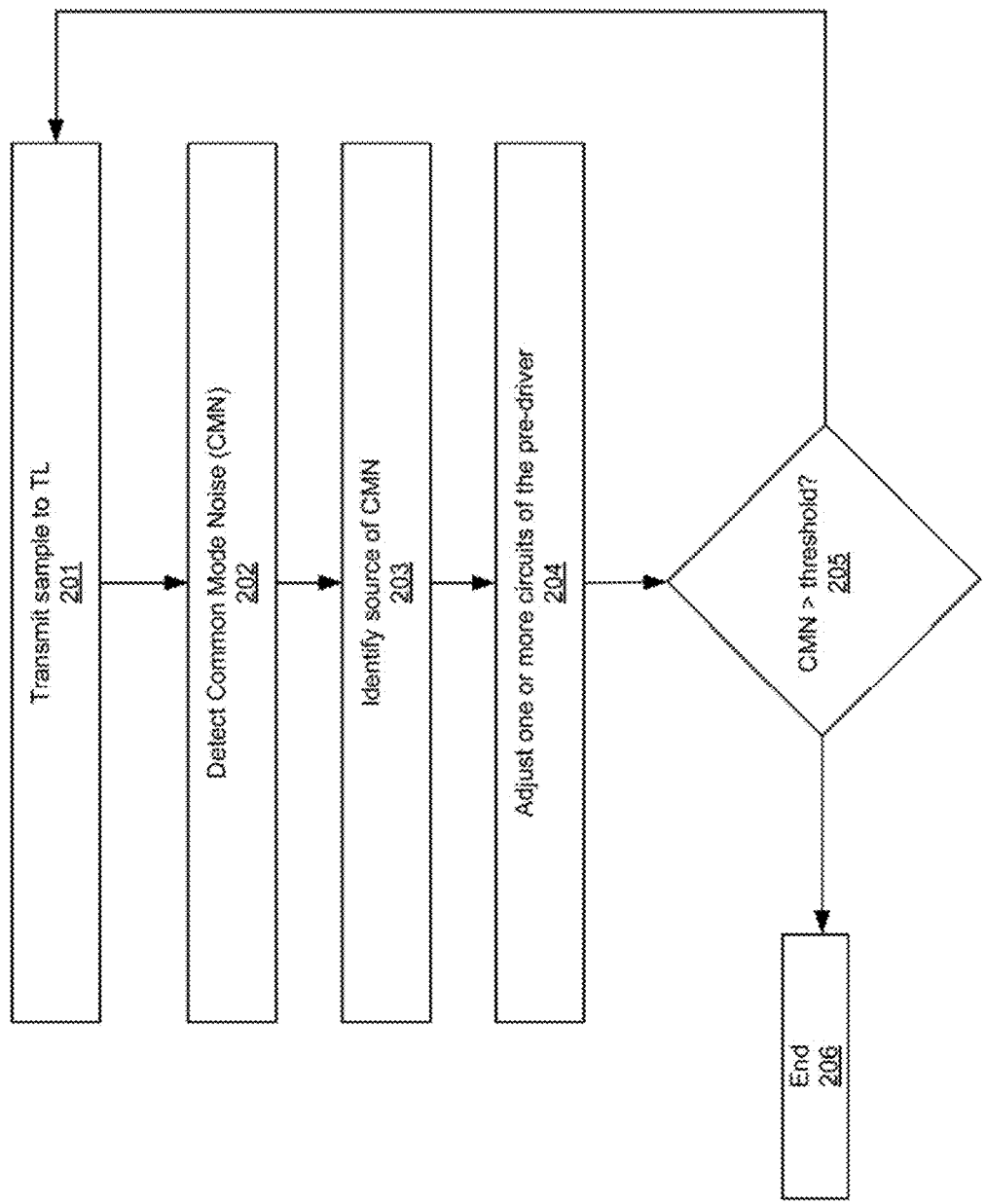
FIG. 2 illustrates a high-level flowchart of a method to detect and tune CMN, according to some embodiments of the disclosure.

FIG. 2 illustrates a high-level flowchart 200 of a method to detect and tune CMN, according to some embodiments of the disclosure. It is pointed out that those elements of FIG. 2 having the same reference numbers (or names) as the elements of any other figure can operate or function in any manner similar to that described, but are not limited to such.

Although the blocks in the flowchart with reference to FIG. 2 are shown in a particular order, the order of the actions can be modified. Thus, the illustrated embodiments can be performed in a different order, and some actions/blocks may be performed in parallel. Some of the blocks and/or operations listed in FIG. 2 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 201, Controller 112 instructs Logic 104 via control signal to enter CMN tuning phase so that Logic 104 enables CMN data path. In this phase, Logic 104 receives a Test Packet for transmission by TX AFE 109. In some embodiments, the Test Packet comprises data having a '1' and a '0' to form a differential data Dp_data and Dn_data for Pre-driver 103. In such embodiments, Controller 112 causes switches s3 and s4 to close via test mode signal. In some embodiments, Controller 112 generates channel control signal to open switches s1 and s2 to detect CMN in the absence of transmission line effects (from TL).

At block 201, CMN signature is detected by observing Vcm node by voltage Analyzer 112 after a sample is transmitted to the TL (or channel). In such embodiments, voltages on differential traces Dp and Dn (i.e., Vdp and Vdn) are summed by Summer 111 and converted into Vcm (common mode voltage). As described with reference to Table 1 of FIG. 1A, CMN may have a unique pattern irrespective of channel discontinuity. Referring back to FIG. 2, this unique pattern is used by voltage Analyzer 112 to detect the presence of CMN.

At block 203, voltage Analyzer 112 decomposes the source(s) of the detected CMN while switches s1 and s2 are open. The source(s) of the detected CMN are signal RT/FT, timing, and amplitude mismatches between Dp and Dn as described with reference to Table 1 of FIG. 1A. Signatures of multiple sources of CMN on Dp and Dn are a superposition of their basis CMN signature. In some embodiments, voltage Analyzer 112 samples Vcm at 1/UI sampling rate or fractional UI rate (e.g., by oversampling fractional 1 UI interval) or by integer oversampling UI rate to identify the source of CMN.

Referring back to FIG. 2, at block 204, voltage Analyzer 112 provides its findings of the source of CMN to Controller 112. Depending on the type of CMN, Controller 112 generates one or more control signals (e.g., c1-c4) to adjust one or more parameters of one or more circuits (e.g., 105-108 of Pre-driver 103). Examples of adjusting one or more parameters include: adjusting termination impedance of drivers driving Dp and/or Dn, adjusting RT/FT of Dp and/or Dn signals, adjusting TOF of Dp and/or Dn, adjusting amplitudes of Dp and/or Dn, adjusting skew between pre-driver stage, modulating supply to Pre-driver 103 to adjust driving strength of Pre-Driver 103, changing driving strength of Pre-Driver 103 by adjusting size of transistors in Pre-Driver 103, changing slew rate capacitance, or changing series RC in pre-driver path, etc.

By adjusting those parameters, CMN on Vcm is reduced. In some embodiments, after cancelling or tuning CMN on Vcm, while switches s1 and s2 are open, the same process of detecting, decomposing, and tuning CMN is performed while switches s1 and s2 are closed.

For example, at block 205, after CMN is considered above a predetermined or programmable threshold, switches s1 and s2 are closed and the process proceeds to block 201. In such embodiments, reflections of signals Dp and Dn from TL are taken into account to cancel CMN caused by such reflections. After cancelling or tuning out CMN while switches s1 and s2 are closed, the processing of tuning CMN completes as indicated by block 206.

Figure 3A:
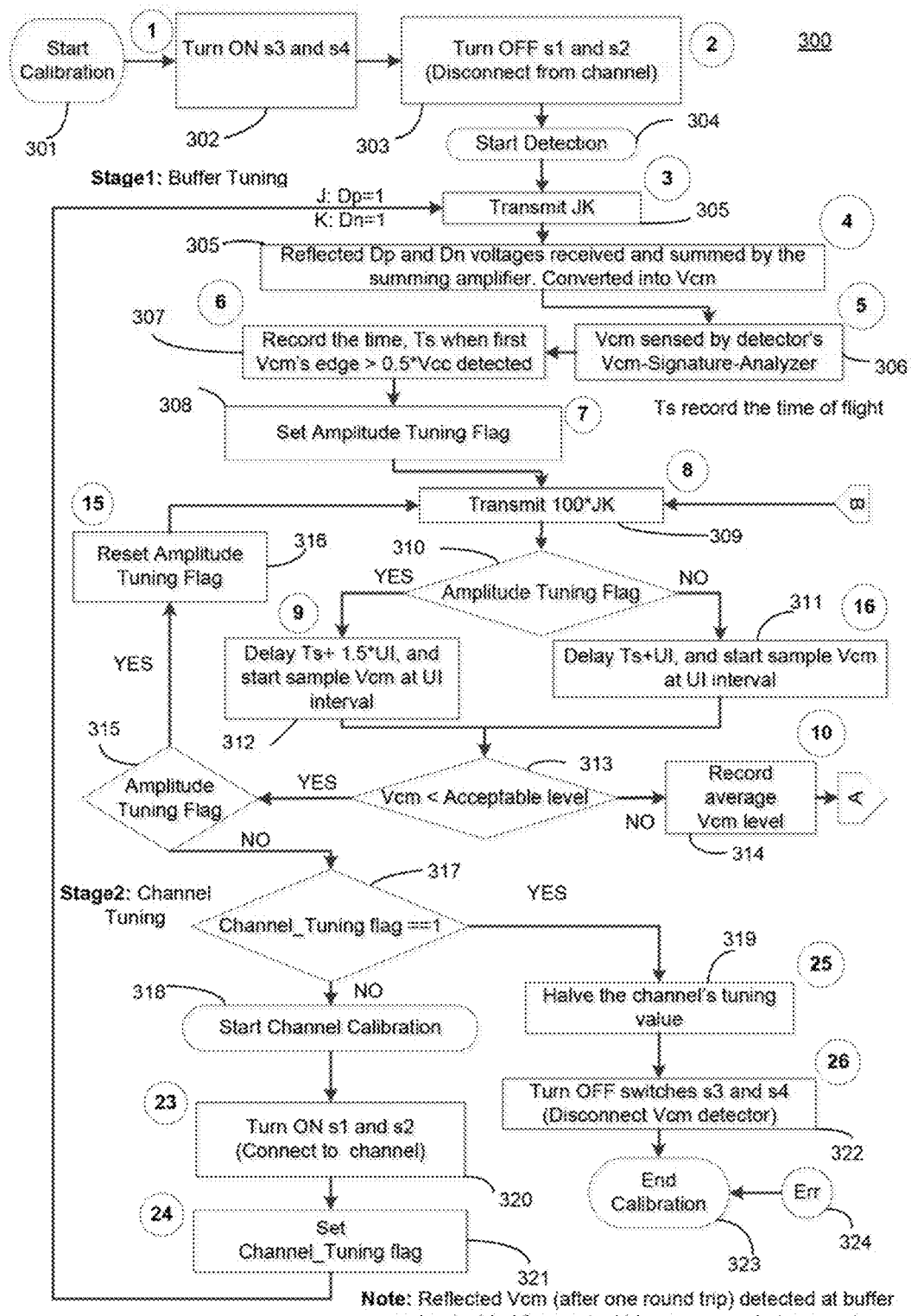
FIGS. 3A-C illustrate detailed flowcharts of a method to detect, decompose, and tune CMN, according to some embodiments of the disclosure.
Figure 3B:
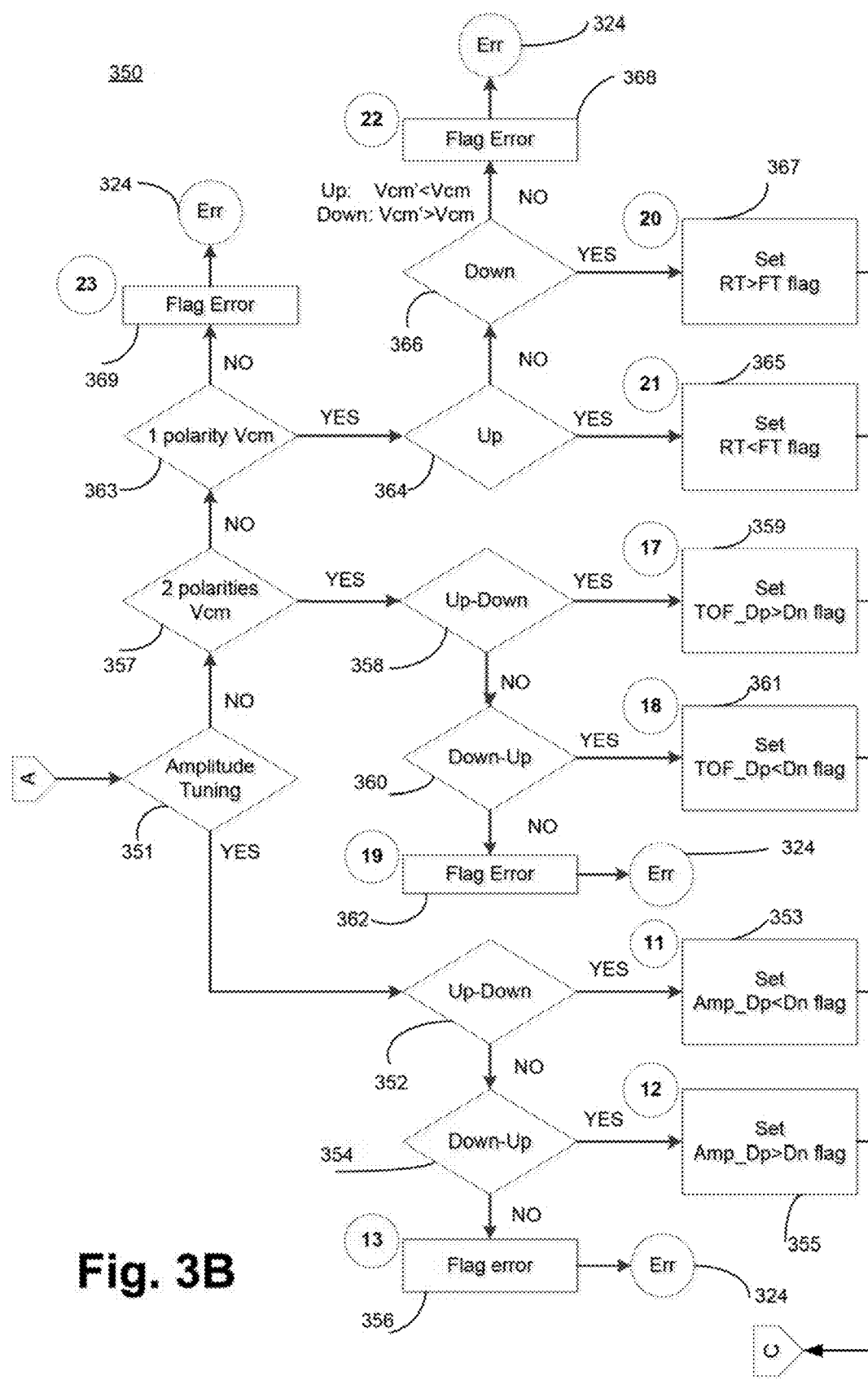
Figure 3C:
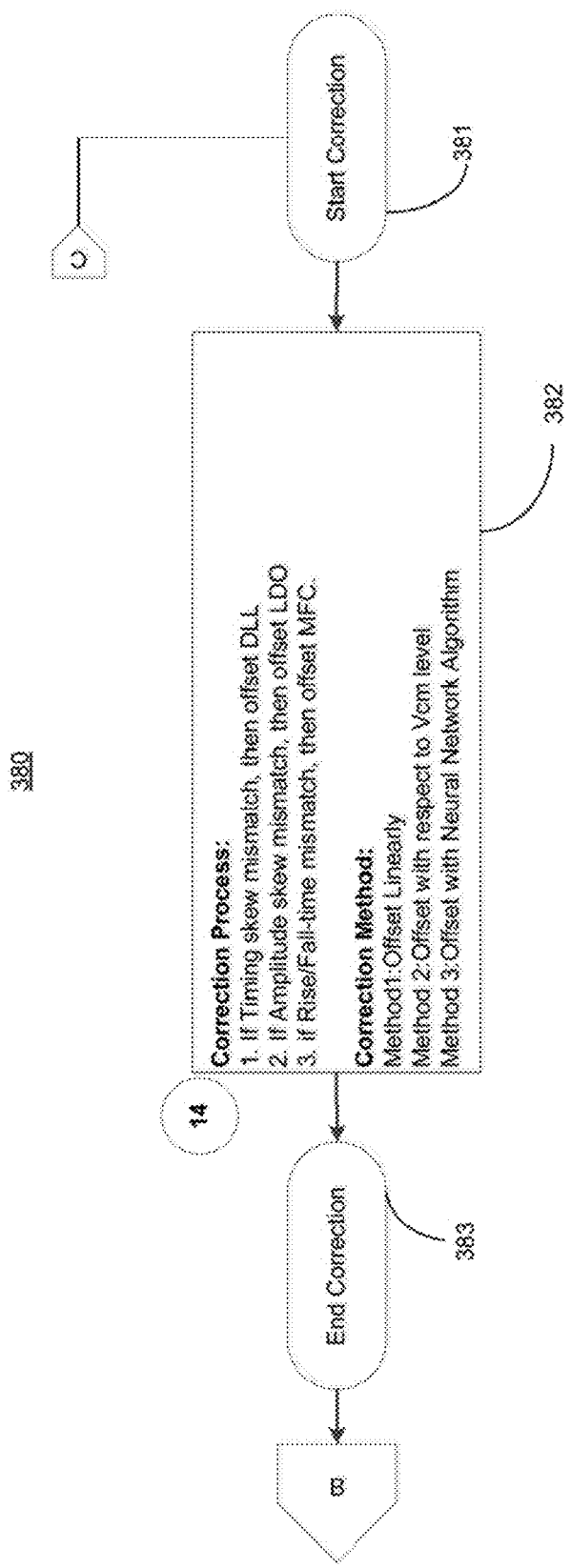

FIGS. 3A-C illustrate detailed flowcharts 300, 350, and 380 of methods to detect, decompose, and tune CMN, respectively, according to some embodiments of the disclosure. It is pointed out that those elements of FIGS. 3A-C having the same reference numbers (or names) as the elements of any other figure can operate or function in any manner similar to that described, but are not limited to such.

Although the blocks in the flowchart with reference to FIGS. 3A-C are shown in a particular order, the order of the actions can be modified. Thus, the illustrated embodiments can be performed in a different order, and some actions/blocks may be performed in parallel. Some of the blocks and/or operations listed in FIGS. 3A-C are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 301, CMN tuning or calibration begins. In some embodiments, CMN tuning or calibration process may begin after a cold boot, transition from sleep mode to wake-up mode, by operating system request, or by periodic sampling when port is disconnected. At block 302, Controller 112 turns on switches s3 and s4 via test mode signal to couple the CMN Analyzer 102 to IO Buffer 101. This operation is also indicated by the number '1' in a circle. Similar numbers are listed next to some but not all operations, and mapped with waveforms in FIGS. 5A-D.

Referring back to FIGS. 3A-C, at block 303, Controller 112 turns off switches s1 and s2 via channel control signal to disconnect (or electrically decouple) IO Buffer 101 from the TL (or channel). This operation is also indicated by the number '2' in a circle. In such an embodiment, CMN tuning is performed for CMN generated by IO Buffer 101. At block 304, the process of detecting CMN begins. At block 305, Test Pattern data transmits JK pattern which is a "10" pattern of two bits to Logic 104 causing Tx AFE 109 to drive logic high on Dp node and logic low on Dn node. This operation is also indicated by the number '3' in a circle.

At block 305, Summer 110 receives reflected Dp and Dn voltage signals and sums them to generate common mode voltage Vcm. This operation is also indicated by the number '4' in a circle. The process then proceeds to block 306. At block 306, Vcm generated by Summer 110 is then analyzed for CMN signature detection and decomposition for the source(s) of CMN by voltage Analyzer 111. In some embodiments, voltage Analyzer 111 determines CMN signature detection and decomposition of the source(s) of CMN as described with reference to Table 1 and FIGS. 1A-B. This operation is also indicated by the number '5' in a circle. The process then proceeds to block 307.

At block 307, Controller 112 receives output of voltage Analyzer 111 and records the time Ts which is when Vcm's first edge crosses half the power supply (Vcc) level (i.e., when first Vcm's edge>0.5*Vcc). This operation is also indicated by the number '6' in a circle. The process then proceeds to block 308. In this example, voltage Analyzer 111 detects that one of the sources of CMN is amplitude mismatch in signals Dp and Dn. At block 308, Controller 112 sets the Amplitude Tuning Flag to logic high, which is set to logic low at initialization. This operation is also indicated by the number '7' in a circle. The process then proceeds to block 309.

At block 309, more bits of Test Pattern are sent to Logic 104. In this example, 100 more samples of "10" bits (also called JK bits) are driven by Tx AFE 109 which periodically drives logic high on Dp (followed by logic low on Dp) and logic low on Dn (followed by logic high on Dn). As described with reference to FIG. 3C, when CMN is tuned (as shown by block 383), the process proceeds to block 309. The process of block 308 is also indicated by the number '8' in a circle. The process then proceeds to block 310.

At block 310, a determination is made whether Amplitude Tuning Flag is logic 1 or logic 0. If the Amplitude Tuning Flag is logic 1 (i.e., YES), then the process proceeds to block 312, else (i.e., NO) the process proceeds to block 311. At block 312, Vcm is sampled first at Ts=1.5 UI, and thereafter it is sampled at every UI. This operation is also indicated by the number '9' in a circle. The process then proceeds to block 313.

At block 313, a determination is made whether the common mode voltage (Vcm) level is below an acceptable programmable level (e.g., a threshold of 20% of power supply Vcc). If Vcm is less than an acceptable programmable voltage level, then the process proceeds to block 315. At block 315, a determination is made whether Amplitude Tuning Flag is logic 1 or logic 0. If the Amplitude Tuning Flag is logic 1 (i.e., YES), then the process proceeds to block 316, else (i.e., NO) the process proceeds to block 317. At block 316, Amplitude Tuning Flag is reset (i.e., is made logic 0) and the process then proceeds to block 309. This operation is also indicated by the number "15" in a circle.

At block 309, more bits of Test Pattern are sent to Logic 104. In this example, 100 more samples of "10" bits (also called JK bits) are driven by Tx AFE 109 which periodically drives logic high on Dp (followed by logic low on Dp) and logic low on Dn (followed by logic high on Dn). The process then proceeds to block 310. This time around, the Amplitude Tuning Flag is logic 0 (i.e., No), and the process proceeds to block 311.

At block 311, Vcm is sampled first at Ts=UI, and thereafter it is sampled at every UI. This operation is also indicated by the number "16" in a circle. The process then proceeds to block 313. At block 313, a determination is made whether the Vcm level is below an acceptable level (e.g., a threshold of 20% of power supply Vcc). The acceptable level can be a programmable level. If Vcm is greater (i.e., NO) than an acceptable voltage level, then the process proceeds to block 314. At block 314, average Vcm level is recorded (e.g., stored in memory or registers). This operation is also indicated by the number "10" in a circle. The process then proceeds to block 351 of FIG. 3B as shown by connector 'A'.

Referring back to FIG. 3A, if Vcm is less than an acceptable voltage level (i.e., YES), then the process proceeds to block 315. Since Amplitude Tuning Flag was reset in block 316, this time around, the process proceeds to block 317 because at block 315 a determination is made that Amplitude Tuning Flag is logic 0. At this point, amplitude mismatch in Dp and Dn is substantially cancelled (because Vcm level is less than the Acceptable level, and the Amplitude Tuning Flag is logic 0). The process then proceeds to block 317 and the second stage of Channel Tuning begins.

At block 317, a determination is made whether Channel_Tuning flag is logic 0 or logic 1. During initialization phase (i.e., when calibration starts at block 301), Channel_Tuning flag is initialized to logic 0. Accordingly, the process initially proceeds to block 318 and channel calibration begins. The process then proceeds to block 320. At block 320, Controller 112 turns on switches s1 and s2 to connect TL to IO Buffer 201. In such embodiments, CMN Analyzer 202 now cancels or reduces CMN with channel non-idealities. This operation is also indicated by the number "23" in a circle. The process then process to block 321.

At block 321, Controller 112 sets the Channel_Tuning flag to logic 1 and the process proceeds to block 305. This operation is also indicated by the number "24" in a circle. Controller 112 then cancels or reduces amplitude mismatch in Dp and Dn caused by channel non-idealities (because channel is now connected to IO Buffer 101 via switches s1 and s2). The process then proceeds to block 317 again. This time around, the Channel_Tuning flag is logic 0 and the process proceeds to block 319.

At block 319, the channel tuning value is halved because the signal is travelling round trip and experiences the same channel non idealities twice. This operation is also indicated by the number "25" in a circle. The process then proceeds to block 322. At block 322, Controller 112 turns OFF switches s3 and s4 using test mode signal. This operation is also indicated by the number "26" in a circle. The process then proceeds to block 323, and Controller 112 updates the Test status by indicating that CMN tuning/calibration is complete. Block 323 is also executed if there is any error (Err) flagged as shown by block 324. Upon issuing an error flag, Controller 112 updates the Test status with the error information.

Referring to FIG. 3B, the process proceeds from block 314 to 351. When Vcm is not less than an Acceptable Level, amplitude mismatch tuning is performed. At block 351, a determination is made whether amplitude tuning is needed based on the logic value of the Amplitude Tuning Flag. Initially, the Amplitude Tuning Flag is logic 1, and so the process proceeds to block 352. At block 352, a determination is made whether the amplitude signature is an Up-Down signature as described with reference to Table 1 of FIG. 1B.

If the amplitude signature is an Up-Down signature, the process proceeds to block 353, and Controller 112 sets a register indicating the amplitude of Dp to be less than the amplitude of Dn i.e., Amp_Dp<Dn flag in the register is set to logic 1. This operation is also indicated by the number "11" in a circle. The process then proceeds to block 381 of FIG. 3C where the process of amplitude mismatch correction begins. At block 382, the CMN correction process is performed. This operation is also indicated by the number "14" in a circle.

In some embodiments, if there is a timing skew mismatch between Dp and Dn, then Controller 112 causes a pre-driver delay offset to be adjusted to match the propagation delays of Dp and Dn or by using a Delay Locked Loop (DLL). In some embodiments, offset to the DLL (not shown) is changed by Timing Control circuit 106. In some embodiments, if there is an amplitude mismatch on Dp and Dn, then Controller 112 causes a voltage regulator (e.g., a low dropout (LDO) regulator) to change its reference offset to adjust the amplitude of the power supply to TX AFE 109. In some embodiments, the reference offset is changed in Amplitude Control circuit 108. In some embodiments, if there is a RT/FT mismatch, then Controller 112 adjusts parameter(s) in RF/TF Control circuit 106 to cancel mismatch of RT/FT in Dp and Dn.

In some embodiments, the offsets in RT/FT of Dp and Dn, the offsets in amplitude of Dp and Dn, the offsets in timing skew between Dp and Dn are corrected (i.e., cancelled or reduced) by any method. For example, offsets can be corrected by the method of offset linearity in which offset is reduced linearly. In another method, offset is corrected with respect to Vcm voltage level. In another method, offset is corrected using Neural Network algorithms. After, CMN is corrected, the process proceeds to block 383 and then to block 309 via connector 'B'.

Referring back to FIG. 3B, if the amplitude signature is a not an Up-Down signature, the process proceeds to block 354. At block 354, a determination is made whether the amplitude signature is a Down-Up signature. If the amplitude signature is a Down-Up signature the process proceeds to block 355 and Controller 112 sets a resister indicating that the amplitude of Dp is greater than the amplitude of Dn (i.e., Amp_Dp>Dn) and this condition is flagged by setting a register to logic 1. This operation is also indicated by the number "12" in a circle. The process then proceeds to block 381 of FIG. 3C where the process of amplitude mismatch correction begins.

Referring back to FIG. 3B, if the amplitude signature is not an Up-Down signature or a Down-Up signature the process proceeds to block 356 and an error is flagged. This operation is also indicated by the number "13" in a circle. The process then proceeds to block 324 and Controller 112 issues a Test Status.

At block 351, a determination is made whether amplitude tuning is needed based on the logic value of the Amplitude Tuning Flag. When Amplitude Tuning Flag is logic 0, then the process proceeds to block 357. At block 357, voltage Analyzer 111 checks whether the CMN is caused by a timing mismatch between Dp and Dn. At block 357, voltage Analyzer 111 checks whether Vcm has two polarities (Up and Down) with reference to the DC level of Vcm. If Vcm has two polarities, the process proceeds to block 358 and voltage Analyzer 111 determines whether the timing mismatch signature is an Up-Down signature.

If it is determined that the timing mismatch signature is an Up-Down signature, the process proceeds to block 359. At block 359, a register is set indicating TOF of Dp is larger than TOF of Dn (i.e., Controller 112 sets the TOF_Dp>Dn flag to logic 1) and the process proceeds to block 381 of FIG. 3C where the process of timing mismatch correction begins. This operation is also indicated by the number "17" in a circle.

Referring back to FIG. 3B, if it is determined that the timing mismatch signature is not an Up-Down signature, the process proceeds to block 360. At block 360, a determination is made whether the timing mismatch signature is a Down-Up signature. If the timing mismatch signature is a Down-Up signature, then the process proceeds to block 361. At block 361, TOF of Dp is made less than TOF of Dn. For example, Controller 112 sets a resister indicating that TOF of Dp is less than TOF of Dn (i.e., TOF_Dp<Dn flag to logic 1) and the process proceeds to block 381 of FIG. 3C, where the process of timing mismatch correction begins. This operation is also indicated by the number "18" in a circle.

Referring back to FIG. 3B, if the timing mismatch signature is not an Up-Down signature or a Down-Up signature the process proceeds to block 362 and an error is flagged. This operation is also indicated by the number "19" in a circle. The process then proceeds to block 324 and Controller 112 issues a Test status (i.e., an error status).

If Vcm does not have two polarities, the process proceeds to block 363 and voltage Analyzer 111 determines whether the CMN signature has one polarity on Vcm (Up or Down) with reference to DC level of Vcm. If Vcm has one polarity, then the CMN signature is a RT/FT skew mismatch signature. The process then proceeds to block 364. At block 364, voltage Analyzer 111 determines whether the RT/FT skew mismatch signature is an Up signature.

If it is determined that the RT/FT skew mismatch signature is an Up signature, the process proceeds to block 365. At block 365, RT of Dn and Dp is made less than FT of Dn and Dp (i.e., Controller 112 sets the RT<FT flag to logic 1 and the process proceeds to block 381 of FIG. 3C, where the process of RT/FT mismatch correction begins. This operation is also indicated by the number "21" in a circle.

Referring back to FIG. 3B, if it is determined that the RT/FT skew mismatch signature is not an Up signature, the process proceeds to block 366. At block 366, voltage Analyzer 111 determines whether the RT/FT skew mismatch signature is a Down signature. If it is determined that the RT/FT skew mismatch signature is a Down signature, the process proceeds to block 367. At block 367, RT of Dn and Dp is made larger than FT of Dn and Dp (i.e., Controller 112 sets the RT>FT flag to logic 1 and the process proceeds to block 381 of FIG. 3C, where the process of RT/FT mismatch correction begins. This operation is also indicated by the number "20" in a circle.

Referring back to FIG. 3B, if the RT/FT skew mismatch signature is not an Up signature or a Down signature the process proceeds to block 368 and an error is flagged. This operation is also indicated by the number "22" in a circle. The process then proceeds to block 324 and Controller 112 issues a Test status (i.e., an error status).

If Vcm does not have a single polarity or two polarities with reference to DC level of Vcm, the process proceeds to block 369. At block 369, an error is flagged. This operation is also indicated by the number "23" in a circle. The process then proceeds to block 324 and Controller 112 issues a Test status (i.e., an error status).

Figure 4:
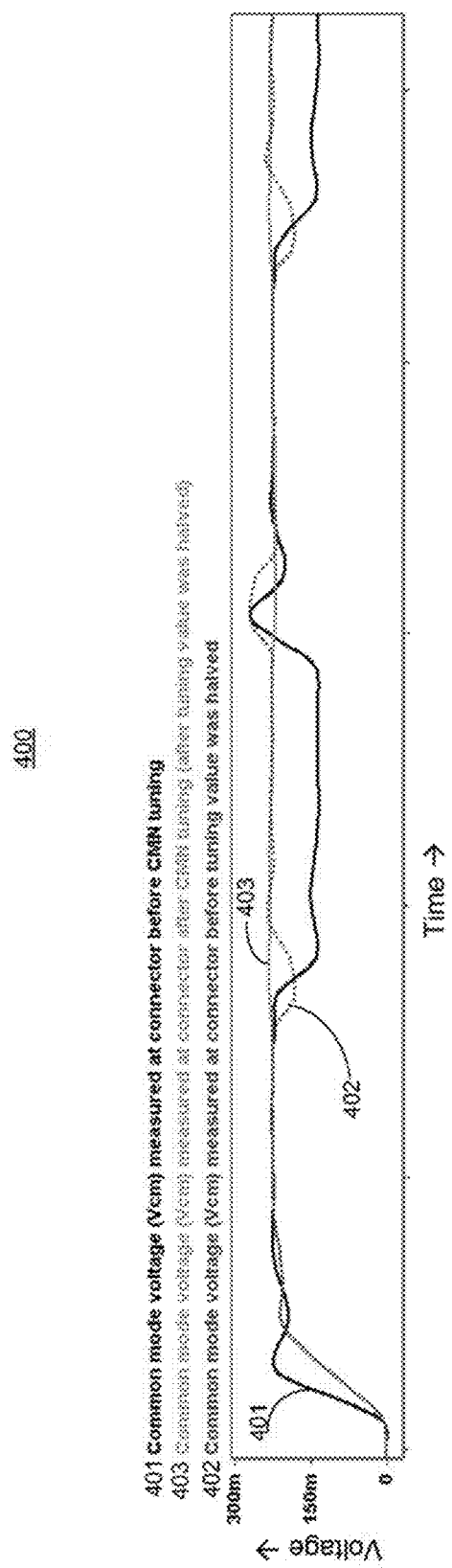
FIG. 4 illustrates a plot showing waveforms of Common Mode Voltage (Vcm) before and after CMN tuning using circuit of FIG. 1A, according to some embodiments of the disclosure.

FIG. 4 illustrates a plot 400 showing waveforms of Vcm before and after CMN tuning using circuit/apparatus of FIG. 1A, according to some embodiments of the disclosure. It is pointed out that those elements of FIG. 4 having the same reference numbers (or names) as the elements of any other figure can operate or function in any manner similar to that described, but are not limited to such. Here, x-axis is time and y-axis is mV.

Waveform 401 is Vcm measured at Dp_pad and Dn_pad before CMN tuning. Waveform 402 is Vcm measured at Dp_pad and Dn_pad after CMN is tuned and before CMN value is halved. Waveform 403 is Vcm measured at Dp_pad and Dn_pad after CMN is tuned and CMN value is halved. Waveform 403 shows that the apparatus and corresponding method of various embodiments tunes out CMN.

FIGS. 5A-D illustrate plots 500, 520, 540, and 560 showing waveforms generated at various operating points (i.e., circled numbers) of the flowcharts of FIGS. 3A-C, according to some embodiments of the disclosure. It is pointed out that those elements of FIGS. 5A-D having the same reference numbers (or names) as the elements of any other figure can operate or function in any manner similar to that described, but are not limited to such. Here, x-axis is time and y-axis is voltage in mV for each plot.

Figure 5A:
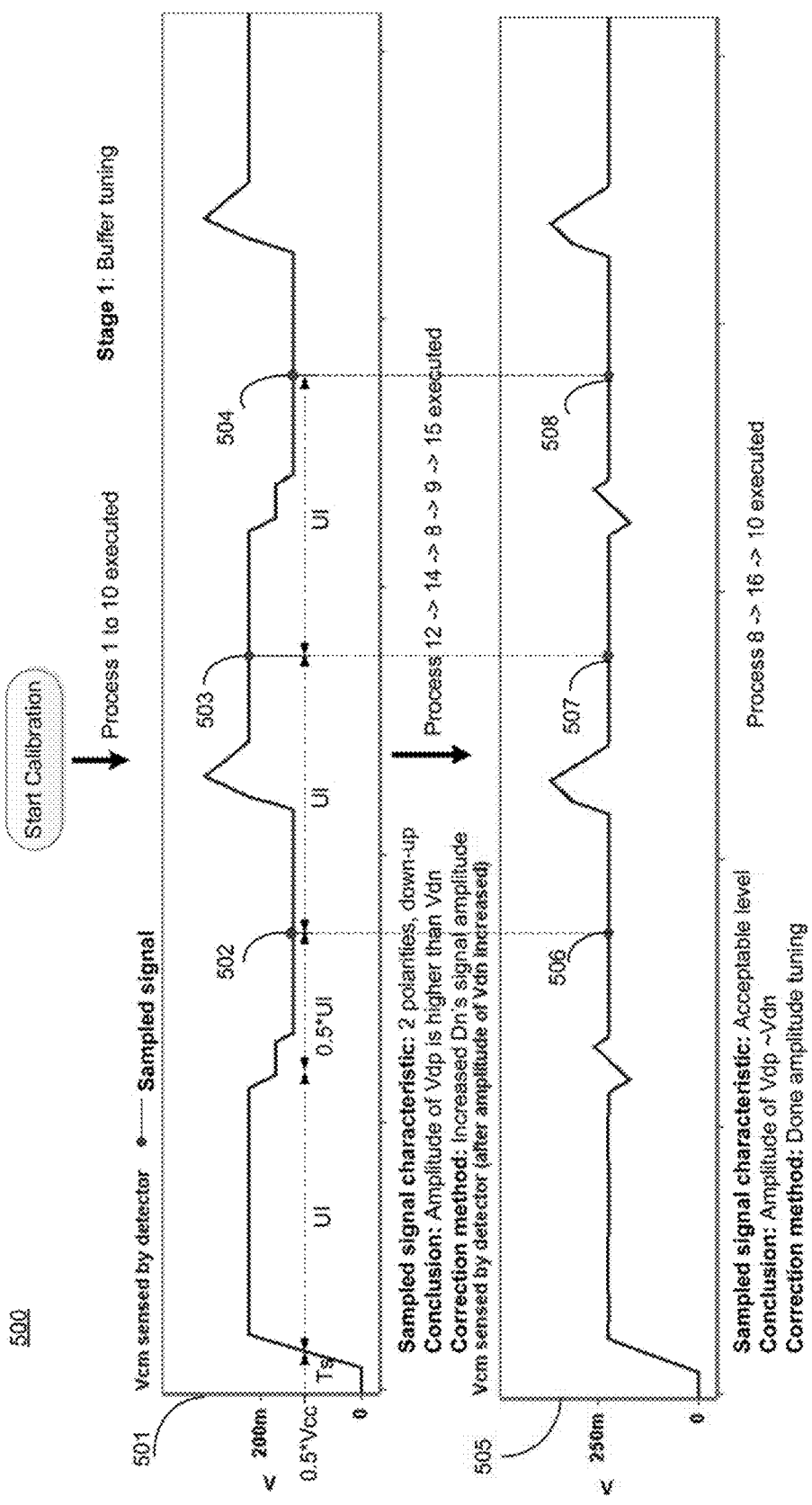
FIGS. 5A-D illustrate plots showing waveforms generated at various points of the flowcharts of FIGS. 3A-C, according to some embodiments of the disclosure.

FIG. 5A illustrates two waveforms 501 and 505. Waveform 501 is the Vcm sensed by Voltage Analyzer 111. Various sample points 502, 503, and 504 are used for detecting and decomposing the CMN signature. Waveform 501 of plot 500 is generated after executing operations 1 to 10. Here, the sampled points show two polarities of Down-Up signature relative to the DC level of Vcm. Voltage Analyzer 111 concludes that the signature of Vcm, in this example, is amplitude mismatch because voltage on Dp node (i.e., Vdp) is higher than voltage on Dn (i.e., Vdn). Controller 112 corrects for this amplitude mismatch by instructing Amplitude Control circuit 109 to increase the amplitude of Dn.

Waveform 505 of plot 500 is generated after executing operations 12→14→8→9→15. Here, after Controller 112 corrects for the amplitude mismatch, signal characteristics of samples 506, 507, and 508 are at an Acceptable level. Controller 112 then concludes that the amplitude mismatch is resolved (i.e., amplitude of Vdp is approx, equal to the amplitude of Vdn). By this time, operations 8→16→10 are executed.

Figure 5B:
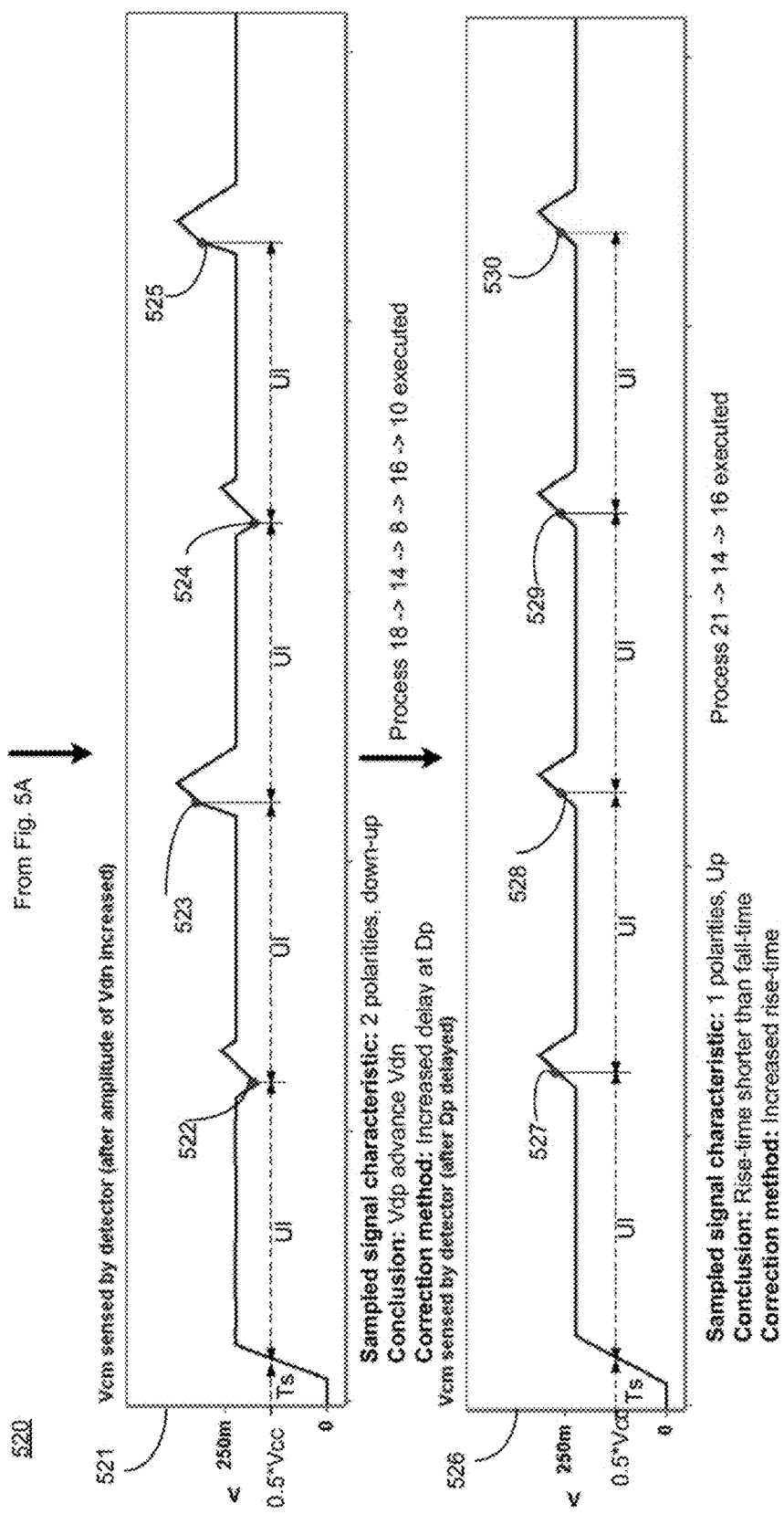

FIG. 5B illustrates two waveforms 521 and 526. Waveform 521 is the Vcm sensed by voltage Analyzer 111 after amplitude of Vdn is increased to match the amplitude of Vdp. Sample points 522, 523, 534, and 525 show two polarities of Down-Up signature relative to the DC level of Vcm. In this example, voltage Analyzer 111 concludes that the CMN signature is a timing mismatch signature. Here, Vdp is ahead of Vdn in time. Continuing with this example, Controller 112 causes Timing Control circuit 107 to increase propagation delay at Dp. By this time, operations 18→14→8→16→10 are executed.

Waveform 526 is the Vcm sensed by voltage Analyzer 111 after TOF of Dp is increased (i.e., Dp is delayed). Sample points 527, 528, 539, and 530 now show one polarity of up signature relative to the DC level of Vcm. In this example, voltage Analyzer 111 concludes that the CMN signature is a RT/FT mismatch signature. In this example, RT of Dp is shorter than FT of Dp. Continuing with this example, Controller 112 causes RT/FT Control circuit 105 to increase RT of Dp. By this time, operations 21→14→16 are executed.

Figure 5C:
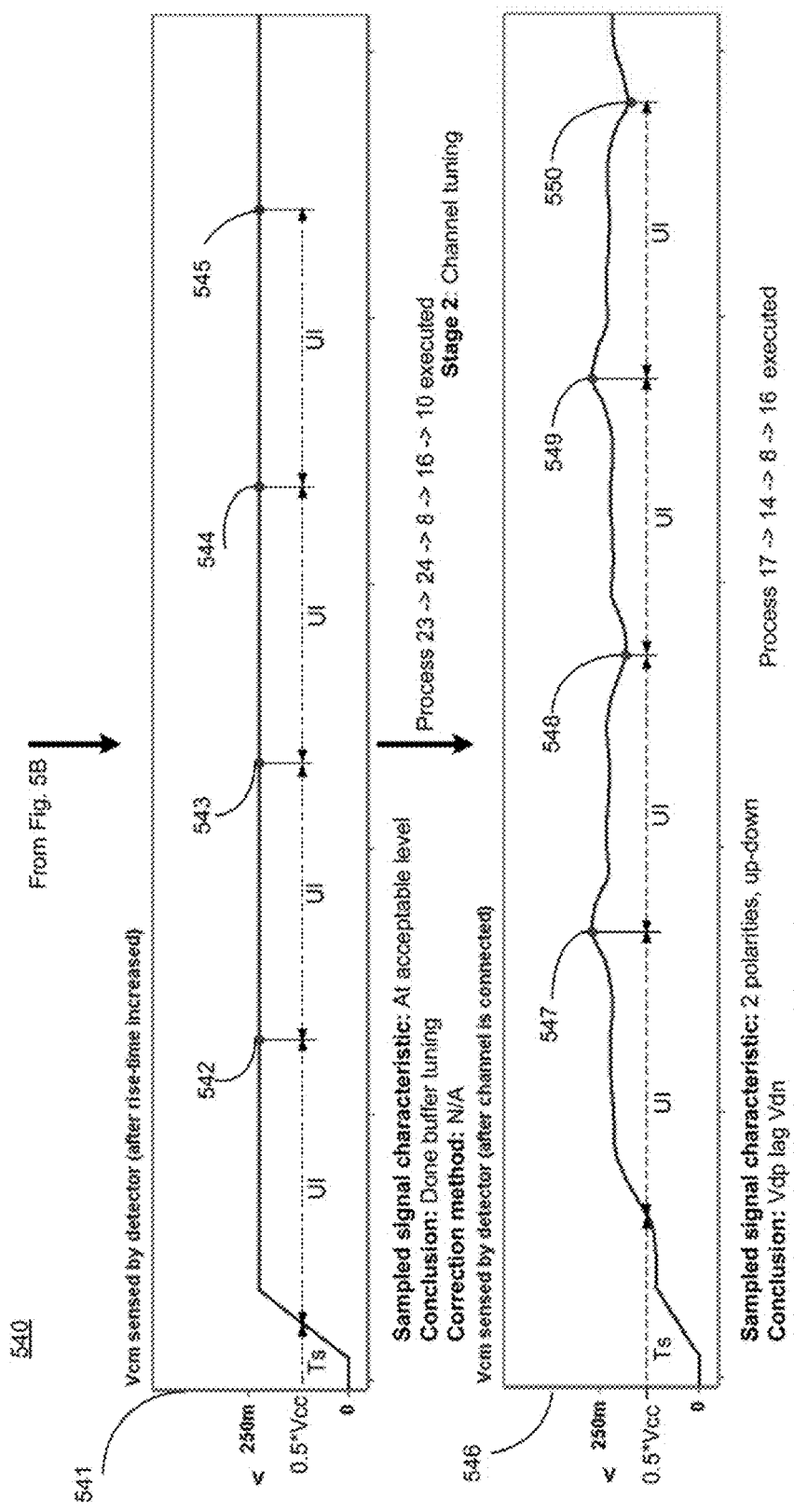

FIG. 5C illustrates two waveforms 541 and 546. Waveform 541 is the Vcm sensed by voltage Analyzer 111 after RT for Dp is increased. Sample points 542, 543, 544, and 545 now show that the Vcm is at acceptable level. In this example, voltage Analyzer 111 concludes that the CMN has been tuned and no correction is needed. By this time, operations 23→14→8→16→10 are executed.

Waveform 546 is the Vcm sensed by voltage Analyzer 111 after switches s1 and s2 are closed and the TL (i.e., channel) is connected to IO Buffer 101. Samples 547, 548, 549, and 550 now show two polarities of up-down signature relative to the DC level of Vcm. In this example, voltage Analyzer 111 concludes that the CMN signature is a timing mismatch signature where Dp lags Dn. Here, Controller 112 causes Timing Mismatch circuit 107 to increase TOP of Dp. By this time, operations 17→14→8→16 are executed.

Figure 5D:
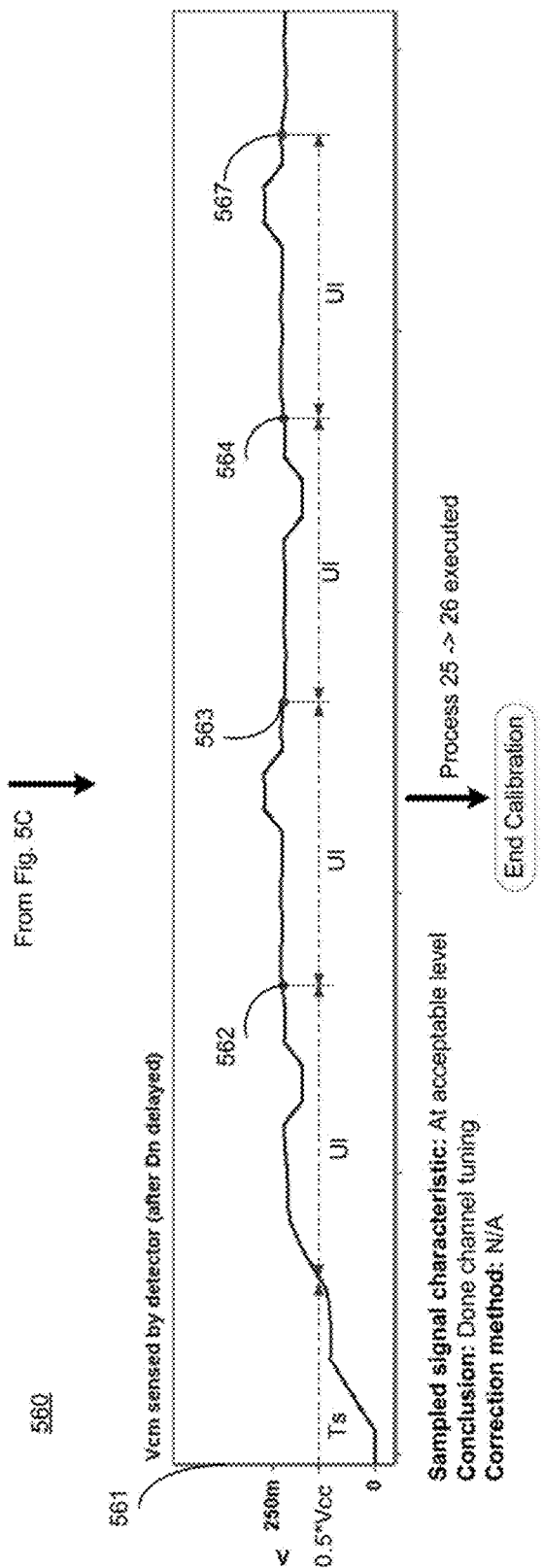

FIG. 5D illustrates a waveform which shows the Vcm sensed by voltage Analyzer 111 after TOP for Dn is increased (i.e., Dn is delayed relative to Dp). Samples 562, 563, 564, and 567 shows that Vcm is at an Acceptable level. In this example, voltage Analyzer 111 concludes that the CMN signature is tuned, and Controller 112 concludes that that no further action is needed. By this time, operations 25→26 are executed. CMN tuning process then ends and switches s3 and s4 are opened to disconnect Analyzer 102 from IO Buffer 101.

Figure 6:
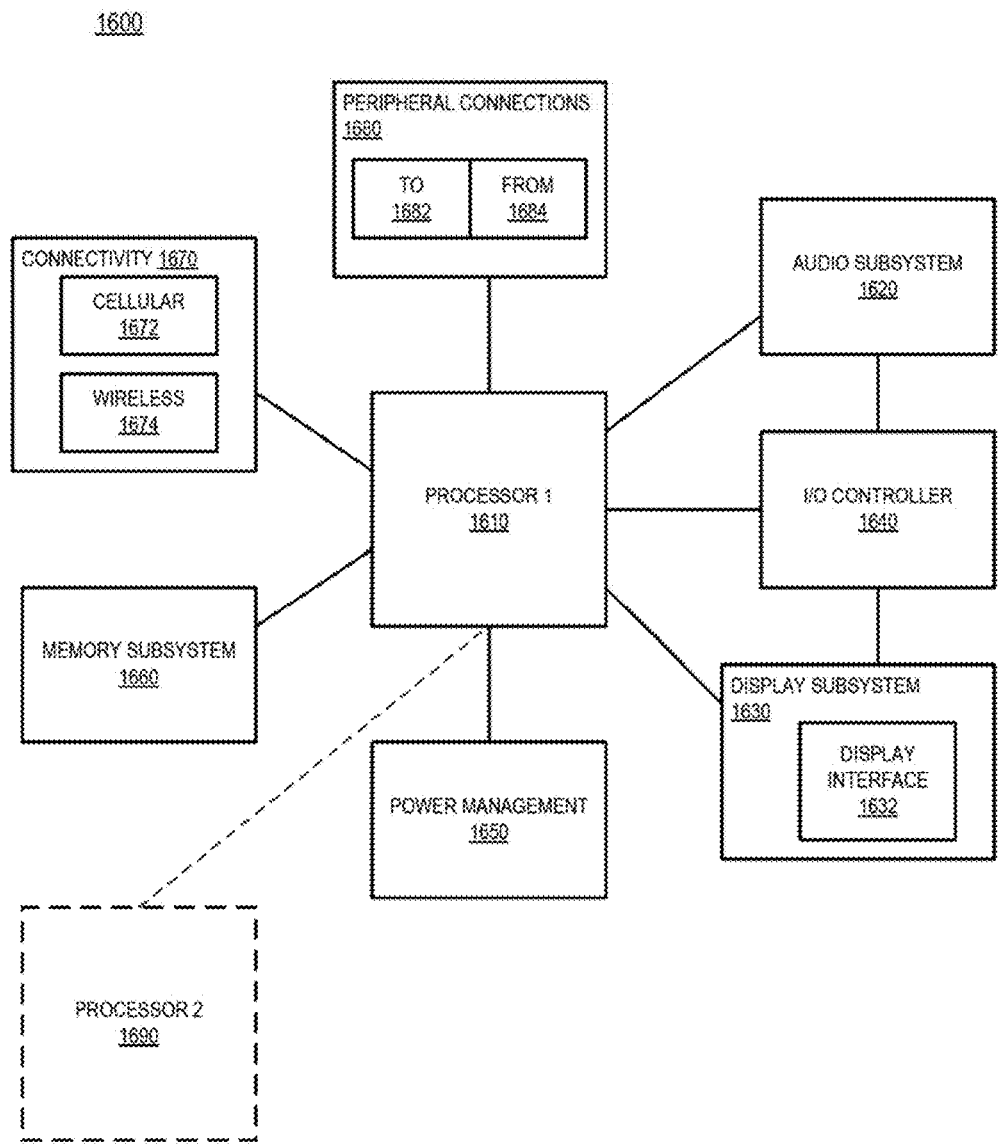
FIG. 6 illustrates a smart device or a computer system or a SoC (System-on-Chip) with apparatus to detect, decompose, and tune CMN, according to some embodiments.

FIG. 6 illustrates a smart device or a computer system or a SoC (System-on-Chip) with circuit/apparatus to detect, decompose, and tune CMN, according to some embodiments. It is pointed out that those elements of FIG. 6 having the same reference numbers (or names) as the elements of any other figure can operate or function in any manner similar to that described, but are not limited to such.

FIG. 6 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes a first processor 1610 with circuit/apparatus to detect, decompose, and tune CMN, according to some embodiments discussed. Other blocks of the computing device 1600 may also include the circuit/apparatus to detect, decompose, and tune CMN of some embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a pre-driver to receive input data and to generate outputs; a transmitter to receive outputs from the pre-driver, the transmitter having first and second outputs for coupling to a transmission media; and a tuning circuit coupled to the transmitter, the tuning circuit is operable to: couple itself to the first and second outputs; analyze signals on the first and second outputs; and adjust one or more circuits in the pre-driver according to the analysis.

In some embodiments, the apparatus comprises: a first switch to couple the first output to the transmission media; and a second switch to couple the second output to the transmission media. In some embodiments, the tuning circuit comprises an amplifier coupled to the first and second outputs, the amplifier to generate common mode signal which is a common mode of the signals of the first and second outputs. In some embodiments, the tuning circuit comprises logic to analyze the common mode signal to identify source of common mode noise on the common mode signal. In some embodiments, the logic to analyze the common mode signal when the first and second switches are closed and when the first and second switches are opened.

In some embodiments, the tuning circuit comprises a controller to adjust the one or more circuits of the pre-driver. In some embodiments, the controller is operable to adjust impedance of the transmitter according to the output of the logic. In some embodiments, the controller is operable to adjust slew-rate of signals generated by the transmitter according to the output of the logic. In some embodiments, the controller is operable to adjust propagation delays of signals generated by the transmitter according to the output of the logic. In some embodiments, the controller is operable to adjust amplitude of signals generated by the transmitter according to the output of the logic.

In some embodiments, the one or more circuits of the pre-driver include at least one of: an impedance control circuit to adjust impedance of the transmitter; a slew-rate control circuit to adjust slew rate of signals generated by the transmitter on the first and second outputs; a timing control circuit to adjust propagation delay of the signals generated by the transmitter on the first and second outputs; or an amplitude control circuit to adjust amplitude of the signals generated by the transmitter on the first and second outputs.

In another example, a system is provided which comprises: a memory; a processor coupled to the memory, the processor having an input-output (I/O) transmitter comprising an apparatus according to the apparatus described above; and a wireless interface for allowing the processor to communicate with another device. In some embodiments, the system further comprises a display interface for allowing a display unit to display content processed by the processor.

In another example, an apparatus is provided which comprises: a pre-driver coupled to a transmitter, the transmitter having a differential output; and a tuning circuit operable to couple to the differential output to tune the pre-driver of the transmitter according to a common mode noise signature of a common mode signal derived from the differential output. In some embodiments, the apparatus comprises: a first switch to couple one of the differential output to a transmission media; and a second switch to couple another of the differential output to the transmission media.

In some embodiments, the tuning circuit comprises an amplifier coupled to the differential output to generate the common mode signal having the common mode noise signature. In some embodiments, the tuning circuit comprises a controller to adjust one or more circuits of the pre-driver according to the common mode noise signature. In some embodiments, the controller is operable to adjust slew-rate of signals generated by the transmitter. In some embodiments, the controller is operable to adjust impedance of the transmitter.

In some embodiments, the controller is operable to adjust of amplitude of signals generated by the transmitter. In some embodiments, the controller is operable to adjust of slew rate control of the transmitter through controlling a feedback capacitor. In some embodiments, the controller is operable to adjust power supply of the pre-driver to change amplitude of signals generated by the transmitter. In some embodiments, the controller is operable to adjust a series RC network to adjust timing of signals generated by the pre-driver for the transmitter. In some embodiments, the controller is operable to adjust driving strength of the pre-driver, and to adjust timing of signals generated by the pre-driver for the transmitter.

In another example, a system is provided which comprises: a memory; a processor coupled to the memory, the processor having an input-output (I/O) transmitter comprising an apparatus according to the apparatus described above; and a wireless interface for allowing the processor to communicate with another device. In some embodiments, the system comprises a display interface for allowing a display unit to display content processed by the processor. In some embodiments, the system comprises a HDMI interface for allowing Audio and video unit content processed by processor. In some embodiments, the system comprises a SDIO interface for allowing storing data at memory card. In some embodiments, the system comprises a USB3, USB2, or PCIe interface. In some embodiments, the system comprises a MIPI based camera, display, or RF-baseband interface.

In another example, a method is provided which comprises: receiving by a pre-driver input data and to generate outputs; receiving by a transmitter outputs from the pre-driver, the transmitter having first and second outputs for coupling to a transmission media; and coupling the first and second outputs; analyzing signals on the first and second outputs; and adjusting one or more circuits in the pre-driver according to the analysis. In some embodiments, the method comprises: coupling the first output to the transmission media; and coupling the second output to the transmission media.

In some embodiments, the method comprises generating a common mode signal which is a common mode of the signals of the first and second outputs. In some embodiments, the method comprises analyzing the common mode signal to identify source of common mode noise on the common mode signal. In some embodiments, the method comprises analyzing the common mode signal when first and second switches which are coupled to the first and second outputs respectively are closed and when the first and second switches are opened.

In some embodiments, the method comprises adjusting the one or more circuits of the pre-driver. In some embodiments, the method comprises adjusting impedance of the transmitter. In some embodiments, the method comprises adjusting slew-rate of signals generated by the transmitter. In some embodiments, the method comprises adjusting propagation delays of signals generated by the transmitter. In some embodiments, the method comprises adjusting amplitude of signals generated by the transmitter.

In another example, an apparatus is provided which comprises: means for receiving by a pre-driver input data and to generate outputs; means for receiving by a transmitter outputs from the pre-driver, the transmitter having first and second outputs for coupling to a transmission media; and means for coupling the first and second outputs; means for analyzing signals on the first and second outputs; and means for adjusting one or more circuits in the pre-driver according to the analysis.

In some embodiments, the apparatus comprises: means for coupling the first output to the transmission media; and means for coupling the second output to the transmission media. In some embodiments, the apparatus further comprises means for generating a common mode signal which is a common mode of the signals of the first and second outputs. In some embodiments, the apparatus comprises means for analyzing the common mode signal to identify source of common mode noise on the common mode signal. In some embodiments, the apparatus further comprises means for analyzing the common mode signal when first and second switches which are coupled to the first and second outputs respectively are closed and when the first and second switches are opened.

In some embodiments, the apparatus further comprises means for adjusting the one or more circuits of the pre-driver. In some embodiments, the apparatus further comprises means for adjusting impedance of the transmitter. In some embodiments, the apparatus further comprises means for adjusting slew-rate of signals generated by the transmitter. In some embodiments, the apparatus further comprises means for adjusting propagation delays of signals generated by the transmitter. In some embodiments, the apparatus further comprises means for adjusting amplitude of signals generated by the transmitter.

In another example, a system is provided which comprises: a memory; a processor coupled to the memory, the processor having an input-output (I/O) transmitter comprising an apparatus according to the apparatus described above; and a wireless interface for allowing the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first switch;
a second switch;
a first circuitry comprising a sample-and-hold apparatus which is coupled to the first and second switches, wherein the first and second switches are to couple to first and second outputs of a transmitter, respectively; and
a second circuitry coupled to an output of the first circuitry, wherein the second circuitry comprises an analyzer to receive a common mode signal from the output of the first circuitry.

2. The apparatus of claim 1, wherein the second circuitry is to analyze the common mode signal on the output of the first circuitry to determine a source of common mode noise.

3. The apparatus of claim 2, comprising:
a third circuitry coupled to an output of the second circuitry, wherein the third circuitry is to control the first and second switches, and wherein the third circuitry is to generate one or more control signals to adjust one or more parameters of a pre-driver circuit.

4. The apparatus of claim 3, wherein the third circuitry is to control switches that couple the first and second outputs of the transmitter to a transmission media.

5. The apparatus of claim 3, wherein the pre-driver circuit comprises at least one of: impedance control circuit, rise or fall time control circuit, amplitude control circuit, or propagation delay control circuit.

6. The apparatus of claim 3, wherein the one or more parameters are at least one of: termination impedance of the transmitter, rise or fall times of signals on the first and second outputs of the transmitter, propagation delay through the pre-driver and the transmitter, or amplitude of signals on the first and second outputs of the transmitter.

7. The apparatus of claim 1, wherein the first circuitry comprises a switch and a capacitor.

8. A system comprising:
a memory;
a processor coupled to the memory, the processing including a transmitter which is coupled to a transmission media, wherein the processor includes:
a first switch;
a second switch;
a first circuitry comprising a sample-and-hold apparatus which is coupled to the first and second switches, wherein the first and second switches are to couple to first and second outputs of the transmitter, respectively; and
a pre-driver circuit coupled to the transmitter, wherein the pre-driver circuit is to control one or more parameters of the transmitter in accordance with signals on the first and second outputs of the transmitter; and
a wireless interface to allow the processor to communicate with another device.

9. The system of claim 8, wherein the one or more parameters are at least one of: termination impedance of the transmitter, rise or fall times of signals on the first and second outputs of the transmitter, propagation delay through the pre-driver and the transmitter, or amplitude of signals on the first and second outputs of the transmitter.

10. The system of claim 8, wherein the pre-driver circuit comprises at least one of: impedance control circuit, rise or fall time control circuit, amplitude control circuit, or propagation delay control circuit.

11. The system of claim 10, wherein the processor comprises:
a second circuitry coupled to an output of the first circuitry, wherein the second circuitry is to analyze a signal on the output of the first circuitry to determine a source of common mode noise; and
a third circuitry coupled to an output of the second circuitry, wherein the third circuitry is to control the first and second switches, and to generate one or more control signals to adjust one or more parameters of the pre-driver circuit.

12. The system of claim 11, wherein the third circuitry is to control switches that couple the first and second outputs of the transmitter to the transmission media.

13. An apparatus comprising:
a transmitter to transmit a signal on to a transmission media;
a detector to detect common mode noise on the transmitted signal;
a first circuitry to identify source of common mode noise on the transmitted signal; and
a second circuitry to adjust one or more parameters associated with the transmitter in accordance with the identified source of common mode noise.

14. The apparatus of claim 13, wherein the detector comprises one of: sample-and-hold circuit, operational amplifier, transconductance based summer circuit, or passive summer circuit.

15. The apparatus of claim 14, wherein the first circuitry is coupled to the detector.

16. The apparatus of claim 14, wherein the second circuitry is to control one or more switches coupled to the detector and the transmitter.

17. The apparatus of claim 14, wherein the second circuitry is to control one or more switches coupled to the transmitter and the transmission media.

18. The apparatus of claim 14, wherein the one or more parameters are at least one of: termination impedance of the transmitter, rise or fall times of signals on first and second outputs of the transmitter, propagation delay through a pre-driver and the transmitter, or amplitude of signals on the first and second outputs of the transmitter.

* * * * *